United States Patent [19]

Kiyohara

[11] Patent Number: 4,500,164

[45] Date of Patent: Feb. 19, 1985

[54] LIGHT TRIGGERED THYRISTOR, INCLUDING A LIGHT GUIDE, WHOSE PARAMETERS ARE RELATED BY AN EQUATION

[75] Inventor: Toyohiko Kiyohara, Hyogo, Japan

[73] Assignee: Mitsubishi Denki Kabushiki Kaisha, Tokyo, Japan

[21] Appl. No.: 447,598

[22] Filed: Dec. 7, 1982

[30] Foreign Application Priority Data

Dec. 7, 1981 [JP] Japan .................. 56-197339

[51] Int. Cl.³ .............................................. G02B 5/14
[52] U.S. Cl. .................... 350/96.10; 357/25; 357/30
[58] Field of Search ............... 350/96.10, 96.15, 96.28; 357/25, 30, 38, 39

[56] References Cited

U.S. PATENT DOCUMENTS

| | | | |
|---|---|---|---|
| 4,131,905 | 12/1978 | Hanes et al. | 357/38 |
| 4,167,746 | 9/1979 | Storm | 350/96.1 |
| 4,305,640 | 12/1981 | Cullis et al. | 350/96.28 |
| 4,368,481 | 1/1983 | Ohashi et al. | 357/30 |
| 4,374,393 | 2/1983 | Kamahara | 357/30 |

FOREIGN PATENT DOCUMENTS

| | | | |
|---|---|---|---|
| 56-1577 | 1/1981 | Japan | 357/30 |
| 56-62379 | 5/1982 | Japan | 357/30 |

OTHER PUBLICATIONS

Yahata et al., "Optimization of Light . . . Thyristors", Ipec-Tokyo Conf., 3/27-3/31 1983, pp. 571-577.

Primary Examiner—William L. Sikes
Assistant Examiner—Brian M. Healy
Attorney, Agent, or Firm—Sughrue, Mion, Zinn, Macpeak and Seas

[57] ABSTRACT

A light triggered thyristor device is improved by providing a light guide having a taper portion and acting to condense incident light while being constructed so as to achieve total internal reflection of the light passing therethrough. With this construction, the exit end of the light guide, as well as the light receiving portion of the thyristor, can be reduced in size.

1 Claim, 2 Drawing Figures

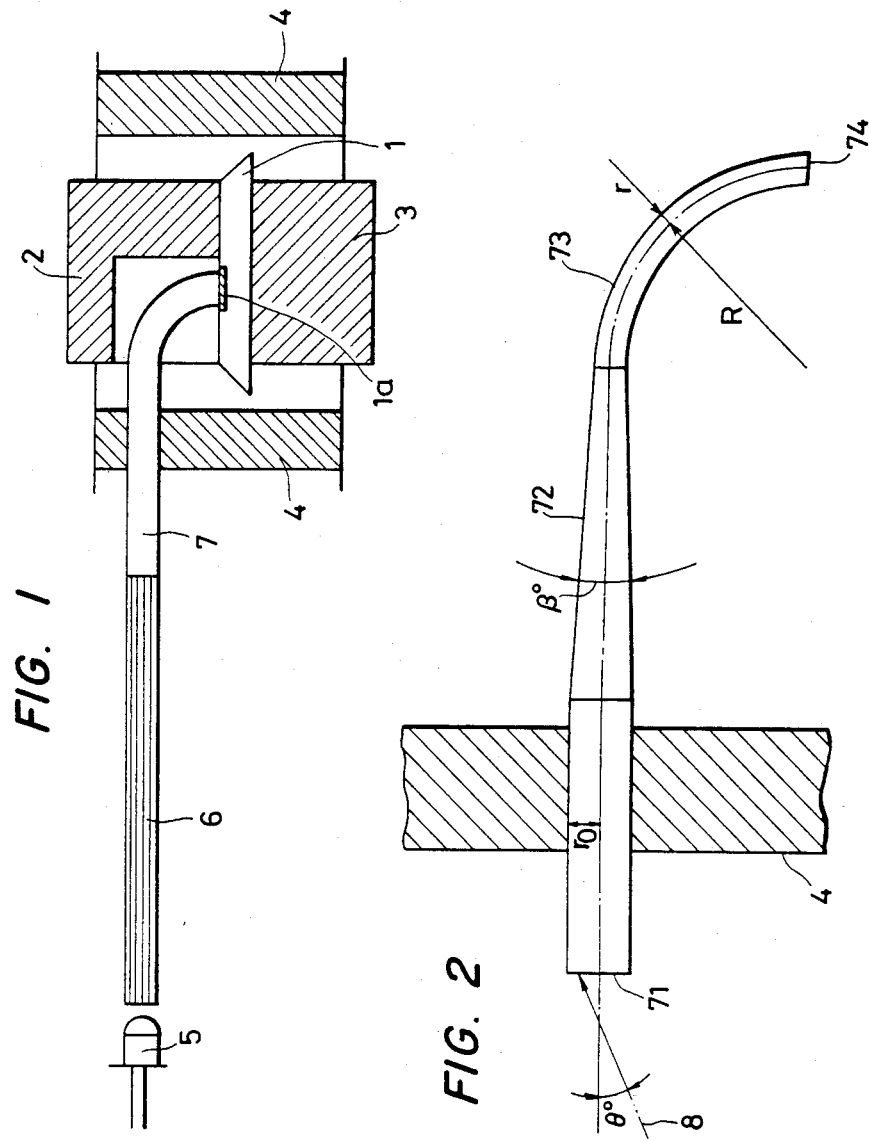

LIGHT TRIGGERED THYRISTOR, INCLUDING A LIGHT GUIDE, WHOSE PARAMETERS ARE RELATED BY AN EQUATION

BACKGROUND OF THE INVENTION

The present invention relates to a light triggered thyristor, and especially to a light guide for transmitting light to a light receiving portion of a thyristor element.

FIG. 1 is a sectional view showing the construction of a conventional light triggered thyristor. In FIG. 1, the numeral 1 designates a light triggered thyristor element having a light receiving portion 1a on the surface thereof. At 2 and 3 are electrodes, at 4 a housing, and at 5 is a light source such as a high powered LED with a directional characteristic. An optical fiber 6 is provided for transmitting light from the light source to the light triggered thyristor, and an internal light guide 7 formed of a bent and transparent glass rod of a constant diameter is fixed on the housing 4 and transmits light received from the optical fiber 6 to the light receiving portion 1a of the light triggered thyristor element 1.

It is necessary, in triggering the light triggered thyristor, to apply light of sufficient energy (several tens of m W) to the light receiving portion 1a. To this end, it is, of course, necessary to provide not only a light source of large power, but an optical fiber having a large numerical aperture and a large diameter as well, to transmit light to the light triggered thyristor with good efficiency. However, the numerical aperture values available are somewhat limited. In an optical fiber of quartz with a low transmission loss and large mechanical strength, the numerical aperture is at the present time limited to the value 0.3. Further, in optical fibers of the multi-component type, which are not as good as quartz fibers in light transmission loss or mechanical strength, the numerical aperture is limited to values from 0.5 to 0.6. Under these circumstances, the diameter of the optical fiber 6 must be increased. On the other hand, it is preferable to have a diameter as small as possible for the light receiving portion 1a of the light triggered thyristor 1, in order to improve the dv/dt capability while maintaining good light-triggering operation sensitivity, since the light-triggering sensitivity is proportional to the product of the dv/dt capability and the area of the light receiving portion 1a.

In a conventional light triggered thyristor having a constant diameter internal light guide, the diameter of the internal light guide 7 has been determined in view of the balance between the output of the light source, the light-triggering sensitivity of the light triggered thyristor element and the dv/dt ratio. Accordingly, the conventional light triggered thyristor undesirably has a disadvantage in that in the case where the light source and the light-triggering sensitivity have been determined, the dv/dt capability cannot be increased to a sufficient value, limiting the area of application of the light triggered thyristor.

SUMMARY OF THE INVENTION

The object of the present invention is to eliminate the above disadvantages of the conventional light triggered thyristor, and to provide a light triggered thyristor with a high dv/dt capability with respect to that of the conventional light triggered thyristor while using the same power light source, by utilizing an internal light guide capable of emitting light from an exit end portion having a small diameter and condensing incident light, thereby minimizing the diameter of the light receiving portion of the thyristor element.

BRIEF DESCRIPTION OF THE DRAWINGS

An embodiment of the present invention will be explained hereinafter with reference to the drawings; in which:

FIG. 1 is a sectional view of a conventional light triggered thyristor; and

FIG. 2 is a sectional view of an internal light guide of a light triggered thyristor according to one embodiment of the present invention.

DETAILED DESCRIPTION OF THE PREFERRED EMBODIMENTS

Referring now to FIG. 2, an internal light guide of a light triggered thyristor according to one embodiment of the present invention is shown. In FIG. 2, numeral 71 designates a light entrance end having a radius $r_0$, and 72 is a tapered portion which is gradually reduced in diameter from $r_0$ to $r$ with a taper angle $\beta$. A bent portion 73 of radius $r$ extends from the tapered portion 72 and has a center line bent with a bending radius $R$. A light exit end 74 also has a radius $r$. Light entering the construction outlined above is designated at 8.

The light guide is made of a transparent material having a refractive index $n_1$ and has nitrogen gas with a refractive index of 1 surrounding the aforementioned transparent material.

As is apparent from FIG. 2, entrance light 8 is incident onto the light entrance end 71 at an angle $\theta$ with respect to a line normal to the light entrance end 71.

The internal light guide of this embodiment of the present invention is fixed to the housing or support 4 such that the light entrance end 71 is connected to the optical fiber 6 and the light exit end 74 is connected to the light receiving portion 1a, similarly to the conventional internal light guide.

With respect to the operational principles of the present invention, entrance light incident to the light entrance end 71 with an entrance angle $\theta$ is transmitted within the tapered portion 72 by repetitive total internal reflections due to the difference between the refractive index $n_1$ of the internal light guide and the refractive index of the nitrogen gas, if the entrance angle $\theta$ is sufficiently small. The light ultimately reaches the light exit end 74 through the bent portion 73. The reflection angle in the internal light guide is small at the tapered position 72 and becomes ever smaller in the bent portion 73. It is necessary in transmitting entrance light by total internal reflection at any light guide portion, including the tapered portion 72 and the bent portion 73, that the reflection angle at, say, the bent portion 73 be larger than the critical angle $\theta_c = \sin^{-1} 1/n_1$ for total internal reflection, which value is determined by the indices of the internal light guide and the nitrogen gas.

To this end, the internal light guide must satisfy the following inequality:

$$n_1 \left( \frac{1 - \frac{r}{R}}{1 + \frac{r}{R}} \right) \sin \left[ \cos^{-1} \left\{ \frac{r_0}{r} \sin \left( \sin^{-1} \frac{\sin\theta}{n_1} + \frac{\beta}{2} \right) \right\} - \frac{\beta}{2} \right] \geq 1$$

Where the variables in the above inequality are the same as those in FIG. 2, and $n_1$ is the refractive index of the internal light guide.

The above inequality can be rationalized by eliminating $\theta_i$ and $\theta_0$ (FIG. 2) and solving for $\theta_R$ using the following three equations: (1) $\sin \theta = n_1 \sin \theta_i$, which holds for entrance light having an entrance angle $\theta$ at the light entrance end 71 with respect to the center axis, when refracted in the internal light guide having a refractive index $n_1$, with the reflection angle $\theta_i$ with respect to the center axis; (2) $r/r_0 = \sin(\theta_i + \beta/2)/\sin(\theta_0 - \beta/2)$ which is an equation holding when a meridial ray incident at $\theta_i$ with respect to the center axis of the taper portion having taper angle $\beta$, entrance radius $r_0$ and exit radius r, is emitted from the tapered portion with the maximum angle $\theta_0$ with respect to the center axis; and (3) $(R+r)/\sin(90-\theta_0) = (R-r)/\sin \theta_R$ which holds when entrance light with an entrance angle $\theta_0$ with respect to the center axis, incident to the bent portion with the bending radius R with respect to the center line at the bent portion of the light guide of radius r, reflects to the outside with a reflection angle $\theta_R$ with respect to the normal line. The angle $\theta_R$ obtained by eliminating the angles $\theta_i$ and $\theta_0$ from the above three equations must be equal to or larger than the critical angle $\theta_c$ ($=\sin^{-1} 1/n_1$) for total internal reflection in a material having the refractive index $n_1$.

The above inequality is considered only with respect to a meridial ray advancing in a plane including the center of the bent portion 73 and the center axis of the internal light guide, but this consideration is fully sufficient since the relection angle at the bent-portion 73 assumes a minimum in this case.

In above inequality (1) there are five dimensionless parameters: The entrance angle $\theta$ of the light, the refractive index $n_1$ of the internal light guide, the ratio $r_0/r$ of the radii at the light entrance and light exit ends, the taper angle $\beta$ of the portion 72, and the ratio $r/R$ of radius r of the internal light guide of the bent portion 73 to the bending radius R. As is apparent from inequality (1) it is preferable that the ratio $r_0/r$ be small, and that the taper angle $\beta$ and the ratio $r/R$ also be kept small.

An example of the formation and dimensioning of the light guide will be explained hereinafter. As mentioned above, the aperture number of the optical fiber 6 has practical limitations, and the light entrance angle $\theta$ to the internal light guide is determined by the aperture number, the entrance angle $\theta$ being represented by the inverse sine of the numerical aperture. Accordingly, the entrance angle $\theta$ is not very large: When the optical fiber is made of quartz and the numerical aperture thereof is 0.3, the entrance angle $\theta$ becomes 17.5°.

On the other hand, the refractive index $n_1$ of the internal light guide is about 1.45 even when quartz having a low refractive index is used therefor.

As stated above, the radius r of the light exit end is preferably made small to increase the dv/dt ratio while maintaining the light-triggering sensitivity. The ratio $r_0/r$ between the light entrance and exit ends is then set at 2 to obtain four times the dv/dt ratio while maintaining the same light-triggering sensitivity as in the conventional device. The ratio $r/R$ between the radius r of the light guide at the bent portion 73 and the bending radius R of the bent portion 73 automatically becomes small if the ratio $r_0/r$ between entrance and exit end radius is made above 1, even when the bending radius R itself is the same as in the conventional device.

The minimum bending radius R at the bent portion of the conventional light guide should be about 5.8 times the radius r of the internal light guide ($R \leq 5.8r = 5.8$) under the condition that $r_0/r = 1(r_0 = r = 1)$, $\beta = 0$, the entrance angle $\theta = 17.5°$ and the refractive index $n_1 = 1.45$ according to the above inequality. If the bending radius R having this same value is applied to the embodiment shown in FIG. 2, the ratio $r/R$ is 0.086 when $r_0 = 1$ and $r = 0.5$. In such case, taper angles $\beta$ satisfying the above inequality become less than 6.5°.

Accordingly, in an internal light guide having a numerical aperture for the optical fiber 6 of 0.3, the same radius at the entrance end and the same bending radius at the bent portion as in the conventional device, and with a taper angle $\beta \geq 6.5°$, a light triggered thyristor with an internal light guide having half the exit end radius in comparison with the conventional device can be obtained while maintaining the same light transmittance. Therefore, the area of the light receiving portion 1a of the light triggered thyristor can be reduced to ¼ the prior value and can therefore obtain four times the dv/dt capability.

Further, an internal light guide having a smaller radius at the exit end can be obtained by varying the taper angle $\beta$ and increasing the bending radius R of the bent portion.

Further, as will be apparent from the above inequality, the minimum reflecting angle becomes large as the left side of the inequality assumes values above 1.

In manufacturing the internal light guide, the reflection interface tends to be uneven so that the total reflections sometimes may not occur.

Therefore, the ability to manufacture a light guide having a larger reflection angle is significant.

The above embodiment has been explained with resepct to an application thereof as an internal light guide of a light triggered thyristor, but the internal light guide of the invention can be, of course, used in other applications where light is condensed, with or without the use of a lens.

The internal light guide may be formed of a light guide having a core glass, and a cladding glass having a lower refractive index than that of the core glass, similarly to conventional optical fibers. In this case, the light loss can be reduced, light loss being caused at the contact position with the support 4, and by the contact between the internal light guide and materials having a high refractive index and light-absorbing characteristic.

Furthermore, the above noted inequality considers the case of light advancement by total internal reflection within the internal light guide. The reduction of light intensity due to the leakage of light from the light guide, with respect to the light intensity of the overall entering light is actually small, though depending on the characteristic of the light source.

As stated above, according to the present invention a light triggered thyristor comprising an internal light guide satisfying the following inequality:

$$n_1 \left( \frac{1 - \frac{r}{R}}{1 + \frac{r}{R}} \right) \sin \left[ \cos^{-1} \left\{ \frac{r_0}{r} \sin \left( \sin^{-1} \frac{\sin \theta}{n_1} + \frac{\beta}{2} \right) \right\} - \frac{\beta}{2} \right] \geq 1$$

can be obtained, thereby achieving a large dv/dt ratio without reducing the light-triggering sensitivity.

What is claimed is:

1. In a light triggered thyristor, including; a light guide made of transparent material with a refractive index $n_1$, and having a light entrance end with a radius $r_0$, a light exit end with a radius r, a tapered portion tapering from the radius $r_0$ to the radius r with a taper angle $\beta$, and a bent portion having a bending radius R, the improvement wherein said light guide satisfying the following inequality when light is incident to said light entrance end with a maxium entrance angle $\theta$ with respect to a line normal to said entrance end:

$$n_1 \left( \frac{1 - \frac{r}{R}}{1 + \frac{r}{R}} \right) \sin \left[ \cos^{-1} \left\{ \frac{r_0}{r} \sin \left( \sin^{-1} \frac{\sin\theta}{n_1} + \frac{\beta}{2} \right) \right\} - \frac{\beta}{2} \right] \gtrapprox 1.$$

* * * * *